United States Patent [19]

Fukuda

[11] Patent Number: 4,567,501
[45] Date of Patent: Jan. 28, 1986

[54] RESISTOR STRUCTURE IN INTEGRATED INJECTION LOGIC

[75] Inventor: Takeshi Fukuda, Tokyo, Japan

[73] Assignee: Fujitsu Limited, Kawasaki, Japan

[21] Appl. No.: 563,887

[22] Filed: Dec. 22, 1983

Related U.S. Application Data

[63] Continuation of Ser. No. 179,936, Aug. 20, 1980, abandoned.

[30] Foreign Application Priority Data

Aug. 27, 1979 [JP]  Japan ................................ 54-108938

[51] Int. Cl.[4] .......................................... H01L 27/04
[52] U.S. Cl. ...................................... 357/51; 357/48;
357/89; 357/92; 148/175
[58] Field of Search ...................... 357/92, 51, 48, 44,
357/46

[56] References Cited

U.S. PATENT DOCUMENTS

| | | | |
|---|---|---|---|
| 3,575,741 | 4/1971 | Murphy | 357/48 |
| 3,865,648 | 2/1975 | Castrucci et al. | 357/92 |
| 3,916,218 | 10/1975 | Berger et al. | 357/544 |
| 4,087,900 | 5/1982 | Yiannoulos | 357/92 |
| 4,101,349 | 7/1978 | Roesner et al. | 357/92 |
| 4,106,049 | 8/1978 | Shinozaki et al. | 357/92 |
| 4,228,450 | 10/1980 | Anantha et al. | 357/51 |

*Primary Examiner*—William D. Larkins
*Attorney, Agent, or Firm*—Staas & Halsey

[57] ABSTRACT

An I$^2$L semiconductor device in which a p-type buried layer is formed on an n+ type silicon substrate by diffusion of boron, an epitaxial n-type layer is grown on the p-type buried layer, a p+ type region is formed in a ring shape to surround the epitaxial n-type layer with the bottom of the p+ region reaching to the p-type buried layer, an n-type resistor layer is formed in the epitaxial n-type layer by diffusion of phosphorus, and connections for electrodes are formed by diffusion of n+ type impurities in such a manner that the connections make contact with the resistor layer.

2 Claims, 8 Drawing Figures

RESISTOR STRUCTURE IN INTEGRATED INJECTION LOGIC

This application is a continuation of application Ser. No. 179,936, filed 8/20/80 now abandoned.

BACKGROUND OF THE INVENTION

1. Field of the Invention

The present invention is directed to a semiconductor device, particularly to the structure of an Integrated Injection Logic (to be called hereinafter as I$^2$L) device provided with a resistor element.

2. Description of the Prior Art

As is generally known in the art to which this invention pertains, Metal Oxide Semiconductor (MOS) integrated circuits and bipolar integrated circuits are mainly used to make up semiconductor digital logic circuits. Bipolar integrated circuits have complex structures and have a limited packing density, but have a comparatively high switching speed. These disadvantages of bipolar integrated circuits are compensated for in an I$^2$L device which has a relatively simple structure and a high function density and which consumes much less electric power.

A typical general purpose, n-p-n, planar, monolithic bipolar transistor is fabricated in an epitaxial n-type layer grown on an n$^+$ buried layer supported by a p-type substrate, and is electrically isolated from other components in the layer by p-type diffusions through the epitaxial layer to the substrate. This isolation of epitaxial n-type layer by means of p-type diffusion is essential to fabricate a bipolar transistor. In this regard, an I$^2$L device can be fabricated without such p-type diffusion, which means a more simplified manufacturing process. This is why an I$^2$L device can compete with MOS integrated circuits.

A typical I$^2$L device is shown in cross-section in FIG. 1A. An epitaxial n-type layer is supported by an n$^+$ substrate, and p-type diffusion through the epitaxial layer forms a p$^+$ region for an injector I and a base region. An n-type diffusion in the base region n$^+$ regions for collectors C$_1$ and C$_2$. As will be understood from the drawing, an I$^2$L device is formed to have a vertical pn junction structure, and if an electrical voltage of the order of 5-6 volts is applied and the vertical pn junction is forwardly biased, an electric current flows downwardly through, and from, the p-type region. In other words, the p-type region is not isolated from the n-type region. Because of this, the diffused p-type region does not function properly as a resistor layer.

In order to overcome the problem just described above, it is generally practiced in the art to form a resistor layer of n-type in the p-type region which is formed simultaneously with the formation of a base region. FIG. 1B illustrates in cross-section a resistor layer formed in accordance with a conventional technique. An epitaxial n-type layer 2 is formed on an n$^+$ type silicon substrate 1, and a p$^+$ type region 3 is formed simultaneously with the formation of a base region. Then, an n$^+$ type electrode connection 4 for a resistor layer is formed simultaneously with the formation of an emitter region. Thereafter, a window is opened through the region where a resistor layer is to be formed using an oxide film 6, and impurities such as phosphorus or arsenic are diffused by conventional ion implantation fabrication technologies through the window, and after a subsequent heat treatment is over, a resistor layer 5 is formed.

Formation of such a resistor layer presents some problems while overcoming the problem mentioned before. Firstly, the resistor layer must be formed in a diffused region which is formed simultaneously with the base region of high impurity concentration by diffusion of impurities of higher impurity concentration in the same manner as with the formation of the emitter region, with the result that the withstand voltage of the resistor layer is relatively low. On the other hand, when impedance is taken into consideration it is advantageous to provide an input resistance in the I$^2$L type semiconductor device, but in such case if an input is from a Transistor-Transistor Logic (TTL) circuit, an input resistor having a withstand voltage of several volts is required. This presents a problem in fabricating a resistor layer with such a high withstand voltage.

Secondly, a resistor layer of the depth of 0.2 μm or less is separately formed by ion implantation of $1 \times 10^{15}$/cm$^2$ dose after fabrication of the emitter region as described above in order to attain a high-value resistance of the order of 500–600Ω/□. Since heat treatment is carried out subsequent to ion implantation, the depth of the emitter region or the width of the base region already formed is changed. This affects the current gain factor hFE that has been previously determined, and it is difficult in this case to control this hFE to have a desired value.

Thirdly, after the resistor layer has been fabricated, the region where the resistor layer is located is not covered by an oxide film, and thus is exposed. In order to cover the region, an oxide film 7 is deposited by conventional chemical vapour deposition. Then, as shown in the drawing, the surface of the semiconductor device has a two tiered structure with a lower oxide layer 6 having a considerable amount of impurities of phosphorus, for example, adhering thereto due to diffusion of the emitter region and formation of the resistor layer, and an upper oxide film 7 deposited by chemical vapour deposition as described above with much less impurities adhering. In an etching operation for opening a window for the connection of the electrode, the lower oxide layer 6 is side etched as well, as shown in FIG. 2, because it is etched at a higher rate due to impurities. When an electrode of aluminum for example is formed in the emitter region through the window, the electrode is likely to be open where the lower oxide layer is side etched because of its poor coverage there.

Formation of the resistor layer according to this conventional technique thus involves a number of problems.

SUMMARY OF THE INVENTION

It is a general object of the present invention to manufacture semiconductor devices having an I$^2$L device and a resistor layer with as little difficulties as possible in connection with the problems enumerated above. In order to achieve this object, a semiconductor device according to the present invention is formed with a region of the same conductivity as the semiconductor substrate so as to reach a buried layer of the opposite conductivity to that of the semiconductor substrate, the region being surrounded by a diffused region of the opposite conductivity, and then a resistor layer is formed in the region. In the semiconductor device thus formed, a resistor layer having a desired resistance is formed while avoiding the need to form an oxide film with the tendency to cause breaking of the electrode connection as experienced in the conventional art. In addition, the established current gain factor which determines the characteristics of the semiconductor device is not affected by the steps of forming the resistor layer according to the present invention, and thus is maintained at a desired fixed value. Since it is not necessary to deposit an oxide film by the chemical vapour deposition technique as was required in the conventional art, the manufacturing process is so much more simplified.

BRIEF DESCRIPTION OF THE DRAWINGS

In the drawings wherein like parts are marked alike.

DESCRIPTION OF THE PREFERRED EMBODIMENT

Figure 1A:
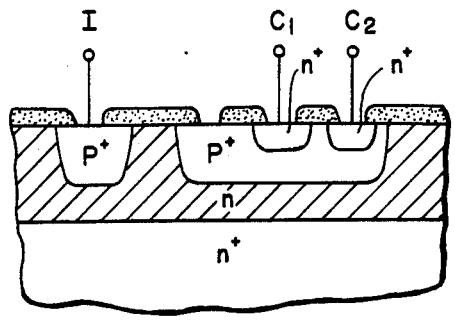
FIG. 1A is a cross-sectional view illustrating an I$^2$L semiconductor device of the prior art.
Figure 1B:
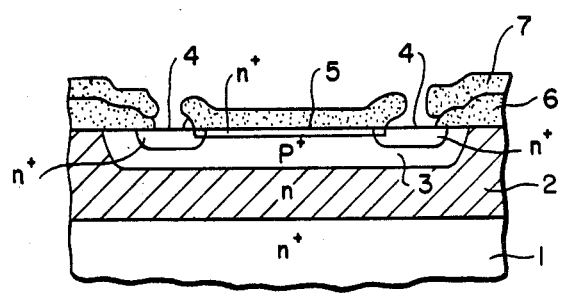
FIG. 1B is a cross-sectional view showing a resistor element formed in accordance with a conventional prior art technique.
Figure 2A:
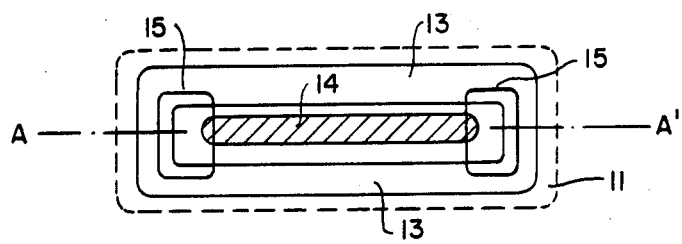
FIG. 2A is a plan view of a resistor element formed in accordance with the present invention.
Figure 2B:
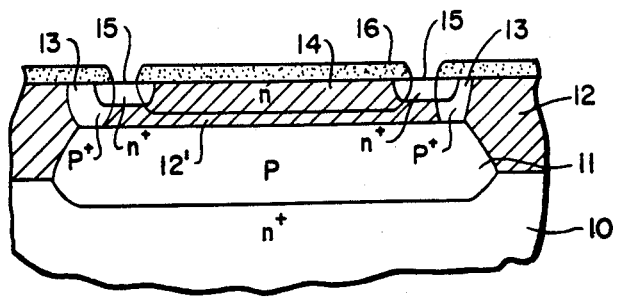
FIG. 2B is a cross-sectional view taken along the line A-A' of FIG. 2A, and FIGS. 3A to 3D are cross-sectional views illustrating the manufacturing steps according to the present invention.

An embodiment of the resistor element according to the present invention is shown in plan view in FIG. 2A and in cross-sectional view of FIG. 2B taken along the line A-A' of FIG. 2A. A p-type buried layer 11 is formed on an n+ type silicon substrate 10 by a conventional process, and an epitaxial n-type layer marked 12, 12' is fabricated on the entire surface of the substrate 10 including the p-type buried layer 11, also by a conventional process. A resistor layer 14 is formed in the epitaxial n-type layer 12' isolated by the p-type buried layer 11 and a p+ type region 13 of a ring shape to be described hereafter, as seen in the plan view of FIG. 2A. After the resistor layer 14 is fabricated, an oxide film 16 is formed to cover the surface of the substrate shown, with the windows opened for the connections of electrodes. Since the epitaxial layer itself has a sheet resistance of several k$\Omega$/□, a high-value diffused resistor layer can easily be fabricated. Furthermore, as the resistor layer 14 is formed in the epitaxial layer of low impurity concentration, the withstand voltage of the resistor layer is much higher than that of the conventional resistor layer.

Steps for manufacturing the semiconductor device of the present invention will now be explained referring to FIGS. 3A to 3D which illustrate the successive manufacturing steps in cross-section.

Figure 3A:
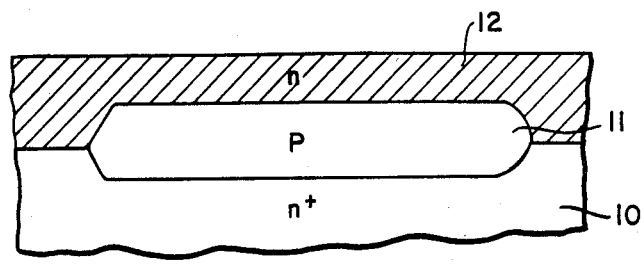

As shown in FIG. 3A, impurities such as boron are diffused into an n+ type silicon substrate 10 by a conventional ion implantation technique or by vacuum evaporation to form a p-type layer 11. An epitaxial n-type layer 12 is deposited on the surface of the substrate including the layer 11 by a known chemical vapour deposition. Whereupon, impurities in the p-type layer 11 are diffused upwardly into the epitaxial layer 12 and presents a profile as shown in the drawing due to the heat applied to the silicon substrate for its heat treatment during the chemical vapour deposition and the heat employed in subsequent heat treatments. The diffused layer then becomes buried layer 11 having the profile as shown.

Figure 3B:
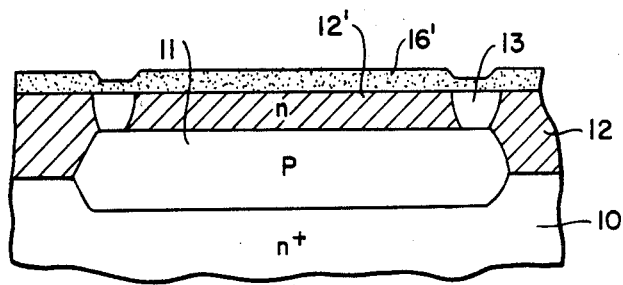

An n+ type diffusion layer is formed in the I$^2$L semiconductor device for the purpose of channel cut-off, and then a base region of said semiconductor device is formed by diffusion. Simultaneously with the formation of said base region, a p+ type region 13 is fabricated in a ring shape as illustrated in FIG. 2A and FIG. 3B on the p-type buried layer 11 such that its bottom is in contact with the p-type buried layer using an oxide film 16'. (The oxide film 16' is shown in the condition after heat treatment of the substrate is over.) Through these steps, a central epitaxial n-type layer 12' is completely isolated from the surrounding epitaxial layer 12 as shown in FIG. 2B.

Figure 3C:
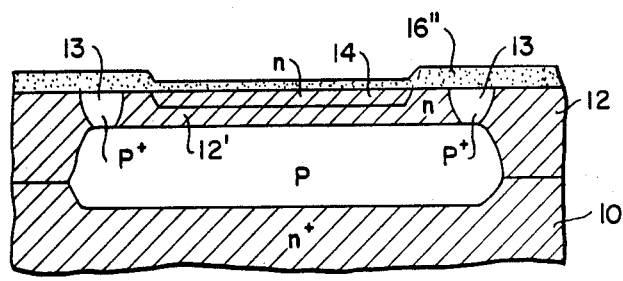

Now, an n-type resistor layer 14 is formed as shown in FIG. 3C in the isolated epitaxial layer 12' by introducing phosphorus for example by a conventional ion implantation or diffusion technique using an oxide film 16''. (The oxide film 16'' is also shown in a condition after heat treatment of the substrate.) This process is carried out quite apart from the I$^2$L semiconductor device, so that the process may be carried out before fabrication of the base region by diffusion. Moreover, it is possible to obtain a high-value diffused resistor layer 14 without making it shallow as has been done according to conventional techniques.

Figure 3D:
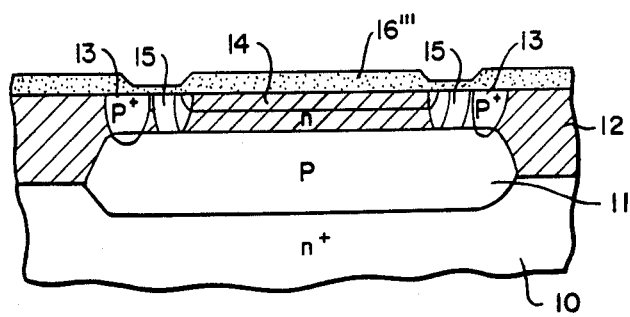

Simultaneously with the formation of the collector region of the I$^2$L semiconductor device, connections 15 of n+ type for electrodes are formed, as shown in FIG. 3D, by diffusion of n+ impurities and using an oxide film 16'''. (Again, the oxide film 16''' is shown in a condition after heat treatment of the substrate.) Connections 15 for electrodes are in contact with the resistor layer 14, and may also be in contact with p+ type region 13 formed in a ring shape so as to surround the resistor layer 14.

After these processes are over, oxidation, window cutting and metallization are carried out in accordance with a known conventional technique so as to form electrodes wiring, and details of these steps will be omitted for brevity.

The present invention involves a method of forming an n-type resistor layer in an epitaxial n-type layer. The sheet resistance of the epitaxial layer is considerably higher compared to the sheet resistance of the resistor layer, so that the sheet resistance of the epitaxial layer can be neglected.

As will be understood from the foregoing description, a resistor layer is formed in an epitaxial layer of which bottom and sides are completely isolated by a conductive layer of opposite conductivity type to that of the substrate according to the present invention, so that the withstand voltage of the resistor layer/silicon substrate structure is high. As the sheet resistance of the epitaxial layer is in the range of several the k$\Omega$/□, it is easy to obtain the resistance of low-value in the order of 100$\Omega$/□ and high-value in the order of 3k$\Omega$/□.

What has been disclosed concerns a manufacturing method in which a resistor region is formed before fabrication of the collector region in an I$^2$L semiconductor device, so that the width of the base region is not altered and the desired current amplification factor hFE can be maintained. Furthermore, an oxide film is formed on the surface of the resistor layer by heat treatment, and this eliminates the need of forming an additional oxide film by conventional chemical vapour deposition. Because of this, there will be no danger of failure of the metallization coverage which was caused by an uneven etching of the two layers making up the surface of the slice as was described before.

In the embodiment shown in detail in FIGS. 3A to 3D and explained fully in the foregoing description, the p-type buried layer 11 was originally 0.3 μm thick which finally became 1.5 μm deep. The width of p+ type diffusion 13 seen in FIG. 3B was 3.0 m. The depth of epitaxial n-type layer 12 was 2.0 μm, and that of the resistor layer 14 and the n+ type diffusion 15, 0.7 μm respectively.

As has been described, the present invention is suitable for fabrication of a high-value input resistor element having the withstand voltage of several volts in an I²L semiconductor device, which has a wide range of applications and serves the purpose of expanding the field of application of the I²L semiconductor device.

Thus, the invention having been described in its best embodiment and mode of operation, that which is desired to be claimed by Letters Patent is:

1. A semiconductor device including an integrated injection logic device and a resistor element comprising:
   a semiconductor substrate of a first conductivity type;
   a semiconductor layer of said first conductivity type formed on said semiconductor substrate;
   a buried layer of a second conductivity type opposite to said first conductivity type formed between said semiconductor substrate and said semiconductor layer;
   a ring shaped diffused region of said second conductivity type reaching to said buried layer and surrounding an area of said semiconductor layer on said buried layer;
   a resistor semiconductor region of said first conductivity type formed in said area;
   a pair of diffused regions of the first conductivity type formed in said area and contacting said resistor region; and
   means for electrically connecting said pair of diffused regions to wirings of said semiconductor device;
   said integrated injection logic device including a pair of spaced apart regions of said second conductivity type and being located in said semiconductor layer and spaced from said substrate, and an additional region of said first conductivity type positioned within one of said pair of spaced apart regions.

2. A semiconductor device of claim 1, wherein said substrate is an n+ type substrate, said buried layer is a p-type layer, said semiconductor layer is an epitaxial n-type layer grown on said buried layer, and said diffused region is a p-type diffused layer.

* * * * *

UNITED STATES PATENT AND TRADEMARK OFFICE
CERTIFICATE OF CORRECTION

PATENT NO. : 4,567,501
DATED : January 28, 1986
INVENTOR(S) : Fukuda

It is certified that error appears in the above-identified patent and that said Letters Patent is hereby corrected as shown below:

Front page, [86] References Cited, "357/544" should be --357/44--.

Column 1, line 42, after "region" (second occurrence) insert --forms--.

Column 3, line 47, "$K\frac{1}{3}/\square$" should be --$K\Omega/\square$--.

Signed and Sealed this

Thirteenth Day of May 1986

[SEAL]

Attest:

Attesting Officer

DONALD J. QUIGG

Commissioner of Patents and Trademarks